United States Patent [19]
Klein et al.

[11] Patent Number: 4,794,330
[45] Date of Patent: Dec. 27, 1988

[54] METHOD AND CIRCUIT FOR MEASURING AND DISPLAYING PHYSICAL VALUES

[75] Inventors: Hans-Hermann Klein, Rösrath; Zoltan Szöcs, Bonn, both of Fed. Rep. of Germany

[73] Assignee: Leybold-Heraeus GmbH, Kön, Fed. Rep. of Germany

[21] Appl. No.: 10,423

[22] Filed: Feb. 3, 1987

[30] Foreign Application Priority Data
Feb. 3, 1986 [EP] European Pat. Off. ............ 86101335

[51] Int. Cl.$^4$ ........................................... G01R 17/04
[52] U.S. Cl. ................................. 324/132; 364/573; 364/571.04
[58] Field of Search .............. 324/132; 364/571, 573; 328/142; 374/171; 340/347 AD, 347 CC

[56] References Cited

U.S. PATENT DOCUMENTS
4,149,120 4/1979 Richter .............................. 324/132

FOREIGN PATENT DOCUMENTS
78592 5/1982 European Pat. Off. .
2549222 1/1977 Fed. Rep. of Germany .
3030990 4/1981 Fed. Rep. of Germany .
3339349 5/1985 Fed. Rep. of Germany .
73721 4/1984 Japan .

OTHER PUBLICATIONS
Arbel, A., "Analog Signal Processing and Instrumentation".

Primary Examiner—Jerry Smith
Assistant Examiner—Stephen M. Baker
Attorney, Agent, or Firm—Spencer & Frank

[57] ABSTRACT

A method and circuit for measuring and displaying a parameter, in which the parameter is sensed by means of a sensor which supplies an output voltage representative of the value of the parameter, the output voltage is compared with a comparison voltage associated with the sensor response characteristic, and a display is produced on the basis of the result of the comparing step. The comparison is effected by supplying the output voltage from the sensor to a first input of a comparator, supplying the comparison voltage to a second input of the comparator, and varying the comparison voltage between successive values extending over the output voltage range of the sensor. The display is produced by providing a succession of parameter value signals each associated with a respective comparison voltage value, supplying each parameter value signal to a latch device in synchronism with occurrence of the associated comparison voltage value, and conducting to a display device from the latch device the parameter value signal which is associated with the comparison voltage value that corresponds to the output voltage value of the sensor.

7 Claims, 2 Drawing Sheets

METHOD AND CIRCUIT FOR MEASURING AND DISPLAYING PHYSICAL VALUES

BACKGROUND OF THE INVENTION

The present invention relates to a method and circuit of measuring and displaying physical values, preferably low temperatures and low pressures, with the aid of a sensor furnishing voltage signals, in which a signal furnished by the sensor is compared, with the aid of electronic means, with the known sensor characteristic which has been stored in these electronic means and a display signal is formed on the basis of this comparison.

It is known to measure physical values with the aid of sensors which produce a voltage signal corresponding to the value being measured. In this connection, the problem frequently arises that the sensor characteristic is not linear, i.e. that a linear dependency does not exist between the signals furnished by the sensor and the values of the physical parameter being measured, which values form the basis of the sensor signals.

Known sensors, in particular for measuring low temperatures and low pressures, have relatively complicated characteristics. For example, sensors employed for such measurements—preferably for temperature measurements—are silicon diodes, resistors made of carbon, Ge or Pt, thermistors or thermocouples.

In a known method of the above-mentioned type for measuring and displaying low temperatures an Si diode serves as the sensor. Its measurement signals are fed to a microprocessor by way of an analog/digital converter. The microprocessor is programmed with a computer program and is also fed the sensor characteristic. This arrangement makes it possible to compute and display the associated temperature value for every measurement signal value. The drawback of this type of measurement value processing is the need to use relatively expensive components, particularly a microprocessor. Moreover, the setting up of the required computer programs, loading these programs into the microprocessor and storage of the sensor characteristic involve relatively high expenditures which contribute to the costs of measuring devices of this type. A further drawback is that a change in the type of sensor requires a change in the microprocessor or at least an expensive change in microprocessor software.

SUMMARY OF THE INVENTION

It is an object of the present invention to provide a measuring and display method and circuit of the above-mentioned type in which the costs for hardware as well as software are substantially lower.

The above and other objects are achieved, according to the invention by a method and circuit for measuring and displaying a parameter, which is sensed by means of a sensor which supplies an output voltage representative of the value of the parameter, the output voltage being compared with a comparison voltage associated with the sensor response characteristic, and a display being produced on the basis of the result of the comparing step.

According to the invention, comparison is effected by supplying the output voltage from the sensor to a first input of a comparator, supplying the comparison voltage to a second input of the comparator, and varying the comparison voltage between successive values extending over the output voltage range of the sensor; and the display is produced by: providing a succession of parameter value signals each associated with a respective comparison voltage value; supplying each parameter value signal to a latch device in synchronism with occurrence of the associated comparison voltage value: and conducting to a display device from the latch device the parameter value signal which is associated with the comparison voltage value that corresponds to the output voltage value of the sensor.

In the practice of the invention, if the signals to the comparator are substantially identical, the comparator activates a latch, such as a latch flipflop, or signal memory, at which is present the display signal, corresponding to the stored sensor characteristic, which corresponds to the measurement signal present at the first input of the comparator; and the display signal passed by the latch is displayed.

The significant advantage of this measuring method is that is can be realized with simple and relatively inexpensive electronic components. A microprocessor is no longer needed. Thus there is no longer any need for expensive software and for loading the software into the microprocessor. The circuit enabling the implementation of the measuring method is simple, clear, and includes but a few components.

An advantageous feature of the method according to the invention is distinguished by the fact that, with the aid of a counter, the address locations of two parallel connected fixed value memories (ROM, EPROM and the like) are actuated in succession and in constant repetition. The fixed value memories contain, respectively, in digital form and at mutually corresponding address locations, representations of the analog values of the measurement signals and of the analog values of the associated display signals. The digital representations at the addressed locations of the measurement signal memory are fed via a digital/analog converter to the comparator and the digital signals corresponding at the addressed locations of the display signal memory are fed to the latch. If the signals applied to the comparator are sufficiently close to one another in value, the comparator activates the latch and the display signal present when the latch is activated is displayed. In a measuring method of this type it is merely necessary to store representations corresponding to the sensor characteristic at the locations of at least one fixed value memory; no need exists for setting up and loading computer programs. If a change is made in the sensor, it is sufficient to also exchange the memories associated with the particular sensor. No change in computer program is required. The change in the measuring devices, if the sensor is changed, is extremely simple.

Due to the use of a latch and its intermediate memory characteristics, it is assured that the display will not flutter. Moreover, without any further expenditures, a BCD (binary coded decimal) output is available at the latch which can be connected, for example, with a recorder or a computer.

The above-described measuring method according to the invention can be used with all voltage furnishing sensors. Measuring accuracy is not limited by the method; it is determined solely by the accuracy of the stored values. The accuracy of these values is itself dependent on the accuracy with which the sensor characteristic is known.

The measuring period can be selected at will. It is a function of the frequency of the counter with the aid of which the memory locations are addressed. If the frequency of the counter is controlled with the aid of an adjustable rate pulse generator, then the measuring time can also be set by adjusting this pulse generator. Compared to a measuring device in which the value to be displayed is computed each time with the aid of a microprocessor, much shorter measuring times can be realized. Resolution depends on the number of existing memory locations and can thus be improved as desired. This advantage is of particular significance if it is desired to spread the display in certain ranges.

There also exists the possibility of omitting the fixed value memory in which representations of the occurring measurement values are digitally stored and to actuate the digital/analog converter directly by means of the counter so that a periodically increasing analog voltage is present at the second input of the comparator. In synchronism with this, the fixed value memory is actuated by the counter and the fixed value memory stores the display signals according to the sensor characteristic. This means that the display signal values may not vary linearly from one memory location to the next. In a solution of this type, a further fixed value memory and the storing of fixed values in that memory are no longer required.

A circuit for implementing the described measuring method advisably includes a comparator, a latch, a counter and at least one fixed value memory addressed by the counter. In addition to a digital/analog converter and a counter, these are the essential components required to construct the circuit for implementing the measuring method.

DESCRIPTION OF THE PREFERRED EMBODIMENTS

Figure 1:
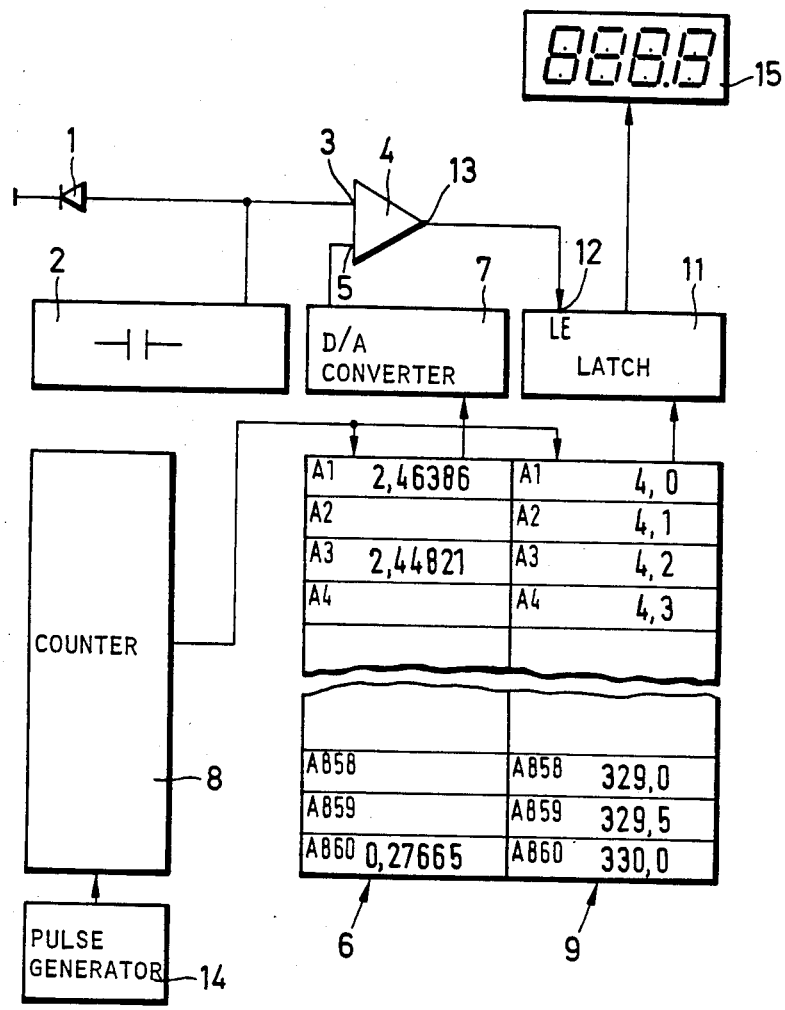
FIGS. 1 and 2 are block circuit diagrams of two embodiments of the present invention.
Figure 2:
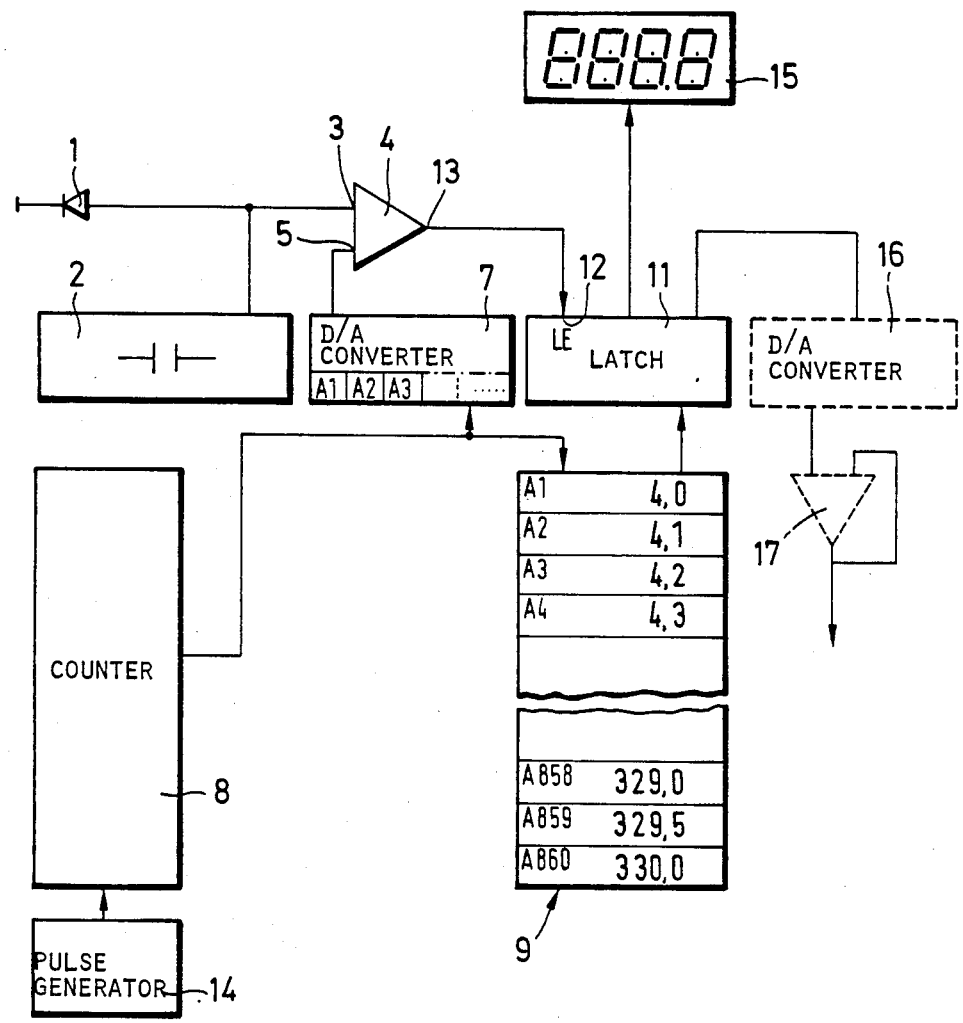

In FIGS. 1 and 2 a sensor 1 receives a constant current from a current source 2. The voltage signal furnished by sensor 1 is supplied to one input 3 of a comparator 4. The second input 5 of comparator 4 receives, in succession and repeatedly, analog signals corresponding to the possible measurement signal values furnished by sensor 1.

In the embodiment shown in FIG. 1, the analog signals fed to input 5 of comparator 4 are derived from a fixed value memory 6 via a digital/analog converter 7. At the addressable locations of memory 6, representations of such measurement signal values are stored in digital form. Memory 6 is addressed by a counter 8 in such a manner that the contents of each memory location of memory 6 are supplied in succession to the digital/analog converter 7. The associated analog values are fed to input 5 of comparator 4.

The corresponding locations of a further fixed value memory 9 are addressed in the same sequence, i.e. in synchronism, by counter 8. Both memories 6 and 9 have the same number of address locations, each having 860 locations in the illustrated embodiments. The values of the physical parameter to be measured are stored in memory 9 at addresses corresponding to those of associated measurement values stored in memory 6. Memory 9 is connected to the signal input of a latch 11 whose activation input 12 is connected to output 13 of comparator 4.

The circuit example shown in FIG. 1 serves to measure and display low temperatures. Numerical values ranging from 4 to 330 are stored at the addresses of memory 9. These numbers correspond to the desired temperature measuring range, i.e. 4° K. to 330° K., in increments selected as a function of the available memory space. In the illustrated embodiment, there are 860 addressable locations so that, for example, increments of 0.1° can be selected for the range from 4° to 25° K. and increments of 0.5° can be selected for the range from 25° to 330° K.

According to the known sensor characteristic, representations of the sensor output voltage values corresponding to the respective temperature values at the associated address locations in memory 9 are stored at the 860 address locations of memory 6.

The measuring method is effected in such a manner that, in response to the count output signals from counter 8, the address locations of the two memories 6 and 9 are interrogated in unison. Counter 8 is actuated by a pulse generator 14, whose frequency is adjustable.

The values of memory 6 interrogated by counter 8 are converted to analog signal pulses by digital/analog converter 7 and are fed in succession to input 5 of comparator 4. In parallel with this, latch 11 provides, at the same frequency and at the same repetition rate, the stored temperature values which correspond to the voltage values present at input 5 of comparator 4.

When the measurement signal furnished by sensor 1 corresponds in value to the voltage applied to input 5 from converter 7, which voltage is derived from the digital value stored at a certain location of memory 6, the signal at comparator output 13 activates input 12 of latch 11. At this moment, a display value originating from the corresponding address location of memory 9 is stored in latch 11. This value is released for display on display 15 by latch 11. The memory locations of memories 6 and 9 are interrogated cyclically so that the temperature reading will be updated after approximately every 860 pulses from generator 14.

FIG. 2 shows an embodiment in which an additional digital/analog converter 16 is connected to latch 11 so as to furnish an analog temperature signal via an amplifier 17. This signal can be fed to a recorder or a computer.

Moreover, memory 9 is no longer associated with a further memory 6 in which fixed voltage values are stored. Instead, counter 8 actuates digital/analog converter 7 directly. This produces a periodically repeated, rising sawtooth voltage at input 5 of comparator 4 corresponding to the range of measurement voltages put out by sensor 1. The count output of counter 8 produces values in digital/analog converter 7 which correspond to the addresses in memory 9. The temperature values in memory 9 are stored according to the sensor characteristic so that, if a certain voltage is present at input 5 of comparator 4, the associated display signal is present at latch 11. If the voltage is also present at input 3 of the comparator, the latch will transfer the display value to display 15.

In the embodiment illustrated in FIG. 2, the signal applied to converter 7 will typically produce a linearly varying analog comparison voltage at comparator input 5. Therefore, any nonlinearities in the response of sensor 1 can be compensated by appropriate selection of the digital values stored in locations A of memory 9.

The invention now being fully described, it will be apparent to one of ordinary skill in the art that many changes and modifications can be made thereto without departing from the spirit or scope of the invention as set forth herein.

What is claimed is:

1. In a method for measuring and displaying a parameter, which method includes sensing the parameter by means of a sensor which supplies an output voltage representative of the value of the parameter, comparing the output voltage with a comparison voltage associated with the sensor response characteristic, and producing a display on the basis of the result of the comparing step, the improvement wherein: digital representations of successive comparison voltage values extending over the output voltage range of the sensor are stored in respective addressable locations of a first memory and digital representations of successive parameter value signals, each associated with a respective comparison voltage value, are stored in respective addressable locations of a second memory, with the address of each location of the second memory corresponding to the address of the location of the first memory which contains the digital representation of the corresponding comparison voltage value; said step of comparing comprises supplying the output voltage from the sensor to a first input of a comparator, supplying the comparison voltage to a second input of the comparator, and varying the comparison voltage by applying the successive digital representations stored in respective locations of the first memory to the input of a digital/analog converter for causing the converter to produce an analog voltage constituting the comparison voltage; and said step of producing a display includes providing a succession of said digital representations of the parameter value signals stored in the second memory, supplying each digital representation of a parameter value signal to a latch device in synchronism with the occurrence of the associated comparison voltage value, and conducting the digital representation of the parameter value signal which is associated with the comparison voltage value that is substantially equal to the output voltage value of the sensor from the latch device to a display device.

2. A method as defined in claim 1 wherein said steps of varying the comparison voltage and supplying each parameter value signal to the latch device are carried out by producing a succession of pulses of adjustable frequency, counting the pulses in a counter and applying the counter count output to the first and second memories as a read-out address signal.

3. A circuit for measuring and displaying a parameter which is sensed by means of a sensor which supplies an output voltage representative of the value of the parameter, comprising:

a comparator for comparing the output voltage with a comparison voltage associated with the sensor response characteristic, said comparator having a first input connected to receive the output voltage from the sensor and a second input connected to receive the comparison voltage;

means for producing successive digital signals, each representing a respective comparison voltage value, and for supplying the digital signals to a digital/analog converter connected to supply the comparison voltage to said second input to vary the comparison voltage between successive values extending over the output voltage range of the sensor, with said means for producing successive digital signals comprising a first memory having a plurality of addressable locations each storing a respective one of the digital signals;

a second memory having a plurality of addressable locations each containing a digital representation of a respective parameter value, with each parameter value being associated with a respective comparison voltage value;

a counter connected to said second memory for addressing each location in sequence in synchronism with the occurrence of the comparison voltage value associated with the digital representation stored in that location; and a latch device connected to said second memory for receiving the digital representation stored in each addressed memory location, said latch device being connected to said comparator for conducting to a display device the parameter value which is associated with the comparison voltage value that corresponds to the output voltage value of the sensor.

4. A circuit as defined in claim 3 wherein said digital/analog converter is connected to said first memory for receiving digital signals stored in successive locations of said first memory; said comparator has an output for providing a comparison signal when the comparison voltage matches the sensor output voltage; and said latch device has an activator input connected to said comparator output for transferring to the display device the digital representation being received by said latch device at the moment of occurrence of a comparison signal.

5. In a method for measuring and displaying a parameter, which method includes sensing the parameter by means of a sensor which supplies an output voltage representative of the value of the parameter, comparing the output voltage with a comparison voltage associated with the sensor response characteristic by supplying the output voltage from the sensor to a first input of a comparator and supplying the comparison voltage to a second input of the comparator, and producing a display on the basis of the result of the comparing step; the improvement wherein:

said method further includes providing a first memory in which representations of successive comparison voltage values extending over the output voltage range of the sensor are stored in respective addressable locations, and a second memory in which representations of successive parameter values, each associated with a respective comparison voltage value, are stored in respective addressable locations;

said step of supplying a comparison voltage includes varying the comparison voltage by addressing the first memory to read-out the successive comparison voltage values stored in respective locations of the first memory, and applying a voltage corresponding to the respective readout comparison voltage values to the second input of the comparator; and said step of producing a display includes addressing the second memory to read-out and provide a succession of said parameter values in synchronism with the occurrence of the associated comparison voltage values, and displaying the parameter value which is associated with the comparison voltage value that is substantially equal to the output voltage value of the sensor.

6. A method as defined in claim 5 wherein: said step of producing a display further includes supplying each parameter value read-out of said second memory to a latch device in synchronism with the occurrence of the associated comparison voltage value; and said step of displaying includes conducting the parameter value in the latch device when the comparison voltage is substantially equal to output voltage of the sensor to a display device.

7. A method as defined in claim 6 wherein: said first and second memories store digital representations of said comparison voltage values and said parameter values, respectively; said step of applying a voltage includes supplying the read-out digital representations of the comparison voltage values to the input of a digital-/analog converter whose output is connected to the second input of the comparator; said digital representations of said parameter values are fed to said latch device; and said step of displaying includes releasing the latch and conducting the digital representation of the parameter value in the latch to a digital display device.

* * * * *